(12) United States Patent
Ito et al.

(10) Patent No.: US 11,094,661 B2
(45) Date of Patent: Aug. 17, 2021

(54) BONDED STRUCTURE AND METHOD OF MANUFACTURING THE SAME

(71) Applicant: KABUSHIKI KAISHA TOYOTA CHUO KENKYUSHO, Nagakute (JP)

(72) Inventors: Hirofumi Ito, Nagakute (JP); Masanori Usui, Nagakute (JP); Makoto Kuwahara, Nagakute (JP)

(73) Assignee: KABUSHIKI KAISHA TOYOTA CHUO KENKYUSHO, Nagakute (JP)

( * ) Notice: Subject to any disclaimer, the term of this patent is extended or adjusted under 35 U.S.C. 154(b) by 62 days.

(21) Appl. No.: 15/753,221

(22) PCT Filed: Nov. 15, 2016

(86) PCT No.: PCT/JP2016/083866
§ 371 (c)(1),
(2) Date: Feb. 16, 2018

(87) PCT Pub. No.: WO2017/086324
PCT Pub. Date: May 26, 2017

(65) Prior Publication Data
US 2018/0240769 A1    Aug. 23, 2018

(30) Foreign Application Priority Data
Nov. 16, 2015    (JP) .............................. JP2015-223628

(51) Int. Cl.
*H01L 23/00*    (2006.01)
*H01L 21/52*    (2006.01)
(Continued)

(52) U.S. Cl.
CPC ............ *H01L 24/29* (2013.01); *B23K 1/0016* (2013.01); *B23K 20/002* (2013.01);
(Continued)

(58) Field of Classification Search
CPC ..... H01L 25/07–074; H01L 25/11–117; H01L 51/448; H01L 25/046;
(Continued)

(56) References Cited

U.S. PATENT DOCUMENTS 6,799,628 B1 * 10/2004 Masseth .............. H01L 23/3731
165/185
6,879,041 B2 * 4/2005 Yamamoto ........ H01L 23/49816
257/737

(Continued)

FOREIGN PATENT DOCUMENTS

| JP | S63-060537 A | 3/1988 |
| JP | H05-015310 B2 | 3/1993 |
| JP | 2006-032888 A | 2/2006 |

OTHER PUBLICATIONS

Feb. 14, 2017 International Search Report issued in International Patent Application No. PCT/JP2016/083866.

*Primary Examiner* — Mary A Wilczewski
*Assistant Examiner* — Tsz K Chiu
(74) *Attorney, Agent, or Firm* — Oliff PLC

(57) ABSTRACT

A highly reliable bonded structure having excellent thermal fatigue resistance characteristics and thermal stress relaxation characteristics is provided. The bonded structure of the present invention comprises a first member, a second member capable of being bonded to the first member, and a bonding part interposed between a first bond surface at the first member side and a second bond surface at the second member side to bond the first member and the second member. The bonding part has at least a bonding layer, a reinforcing layer, and an intermediate layer. The bonding layer is composed of an intermetallic compound and bonded to the first bond surface.

16 Claims, 14 Drawing Sheets

(51) Int. Cl.
*B23K 20/00* (2006.01)
*H01L 23/48* (2006.01)
*B23K 1/00* (2006.01)
*B23K 35/26* (2006.01)
*B23K 35/30* (2006.01)
*H01L 23/373* (2006.01)
*B23K 101/40* (2006.01)
*B23K 103/08* (2006.01)

(52) U.S. Cl.
CPC ........ *B23K 35/262* (2013.01); *B23K 35/3033* (2013.01); *H01L 21/52* (2013.01); *H01L 23/3735* (2013.01); *H01L 23/48* (2013.01); *H01L 24/32* (2013.01); *H01L 24/83* (2013.01); *B23K 2101/40* (2018.08); *B23K 2103/08* (2018.08); *H01L 24/13* (2013.01); *H01L 24/14* (2013.01); *H01L 24/17* (2013.01); *H01L 24/81* (2013.01); *H01L 2224/04026* (2013.01); *H01L 2224/05655* (2013.01); *H01L 2224/08503* (2013.01); *H01L 2224/13101* (2013.01); *H01L 2224/1403* (2013.01); *H01L 2224/2908* (2013.01); *H01L 2224/2917* (2013.01); *H01L 2224/2918* (2013.01); *H01L 2224/29019* (2013.01); *H01L 2224/29076* (2013.01); *H01L 2224/29105* (2013.01); *H01L 2224/29109* (2013.01); *H01L 2224/29111* (2013.01); *H01L 2224/29113* (2013.01); *H01L 2224/29116* (2013.01); *H01L 2224/29118* (2013.01); *H01L 2224/29124* (2013.01); *H01L 2224/29139* (2013.01); *H01L 2224/29144* (2013.01); *H01L 2224/29147* (2013.01); *H01L 2224/29155* (2013.01); *H01L 2224/29169* (2013.01); *H01L 2224/29171* (2013.01); *H01L 2224/29179* (2013.01); *H01L 2224/29181* (2013.01); *H01L 2224/29184* (2013.01); *H01L 2224/32225* (2013.01); *H01L 2224/32245* (2013.01); *H01L 2224/32503* (2013.01); *H01L 2224/8121* (2013.01); *H01L 2224/81815* (2013.01); *H01L 2224/83* (2013.01); *H01L 2224/8321* (2013.01); *H01L 2224/83065* (2013.01); *H01L 2224/83075* (2013.01); *H01L 2224/8381* (2013.01); *H01L 2224/83097* (2013.01); *H01L 2224/83201* (2013.01); *H01L 2224/83825* (2013.01); *H01L 2924/10272* (2013.01); *H01L 2924/13055* (2013.01); *H01L 2924/35121* (2013.01)

(58) Field of Classification Search
CPC ........... H01L 29/66348; H01L 29/7428; H01L 29/66325–66348; H01L 29/7393–7398; H01L 2924/13055; H01L 29/083–0834; H01L 2924/13024; H01L 2924/13034–13035; H01L 27/0262; H01L 29/74–749; H01L 2924/1301–13035; H01L 29/66363–66401; H01L 29/0839; H01L 27/0817; H01L 27/1027; H01L 27/0259–0262; H01L 27/0623; H01L 27/0635; H01L 27/0647–067; H01L 27/0711–0722; H01L 27/075–0783; H01L 27/082–0828; H01L 27/1022–1026; H01L 2224/48155–48165; H01L 2224/48225–4824

See application file for complete search history.

(56) References Cited

U.S. PATENT DOCUMENTS

| | | | | |
|---|---|---|---|---|
| 6,919,137 | B2* | 7/2005 | Kawashima | B23K 35/007 257/779 |
| 8,178,212 | B2* | 5/2012 | Simpson | B32B 7/04 419/10 |
| 8,742,600 | B2* | 6/2014 | Chang | H01L 24/32 257/782 |
| 9,196,602 | B2* | 11/2015 | Ren | H01L 24/32 |
| 9,671,362 | B2* | 6/2017 | Horkheimer | B32B 37/1292 |
| 9,759,679 | B2* | 9/2017 | Carlson | B81B 7/007 |
| 10,058,951 | B2* | 8/2018 | Yoon | H01L 24/83 |
| 2001/0040180 | A1* | 11/2001 | Wittebrood | B23K 35/002 228/219 |
| 2002/0086179 | A1* | 7/2002 | Wittebrood | B23K 35/0238 428/652 |
| 2002/0100986 | A1* | 8/2002 | Soga | H01L 24/32 257/779 |
| 2002/0121709 | A1* | 9/2002 | Matsuki | H01L 23/49811 257/786 |
| 2002/0175205 | A1* | 11/2002 | Wittebrood | B23K 35/0238 228/249 |
| 2003/0119300 | A1* | 6/2003 | Chiu | H01L 24/03 438/615 |
| 2003/0124832 | A1* | 7/2003 | Tseng | H01L 24/03 438/613 |
| 2003/0160021 | A1 | 8/2003 | Platt et al. | |
| 2003/0209465 | A1* | 11/2003 | Shoji | H01L 23/10 206/710 |
| 2004/0007384 | A1* | 1/2004 | Soga | H05K 3/3485 174/260 |
| 2004/0035911 | A1* | 2/2004 | Dockus | B23K 35/002 228/56.3 |
| 2004/0185275 | A1* | 9/2004 | Smith | B32B 7/06 428/457 |
| 2004/0256730 | A1* | 12/2004 | Hirano | H01L 23/482 257/765 |
| 2005/0079307 | A1* | 4/2005 | Blum | B32B 27/08 428/35.8 |
| 2005/0186379 | A1* | 8/2005 | Rhee | B32B 27/08 428/36.91 |
| 2007/0057373 | A1* | 3/2007 | Okumura | H01L 23/051 257/746 |
| 2007/0216034 | A1* | 9/2007 | Bachman | H01L 21/563 257/778 |
| 2010/0024336 | A1* | 2/2010 | Stevenson | B32B 18/00 52/309.13 |
| 2010/0132404 | A1* | 6/2010 | Shuja | F28D 15/0266 62/524 |
| 2010/0203790 | A1* | 8/2010 | Moulton | B32B 5/02 442/394 |
| 2010/0276787 | A1* | 11/2010 | Yu | H01L 25/50 257/621 |
| 2012/0091576 | A1* | 4/2012 | Tsai | H01L 24/03 257/737 |
| 2012/0321907 | A1* | 12/2012 | Hoivik | B81C 1/00269 428/615 |
| 2013/0152990 | A1* | 6/2013 | Lai | B23K 35/302 136/237 |
| 2013/0200510 | A1* | 8/2013 | Soyano | H01L 23/3677 257/712 |
| 2013/0341075 | A1* | 12/2013 | Becker | H05K 1/0281 174/255 |
| 2017/0040276 | A1* | 2/2017 | Morris | H01L 23/49811 |
| 2017/0062680 | A1* | 3/2017 | Yoo | H01L 33/60 |
| 2018/0323358 | A1* | 11/2018 | Tollefsen | H01L 35/08 |

* cited by examiner

FIG.1A
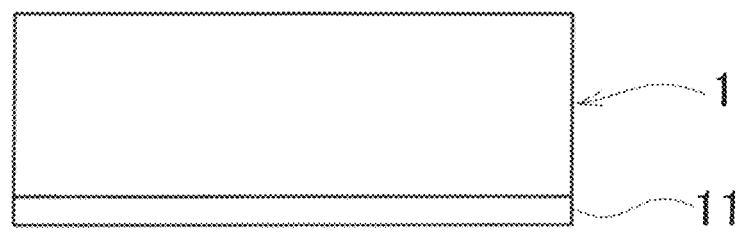
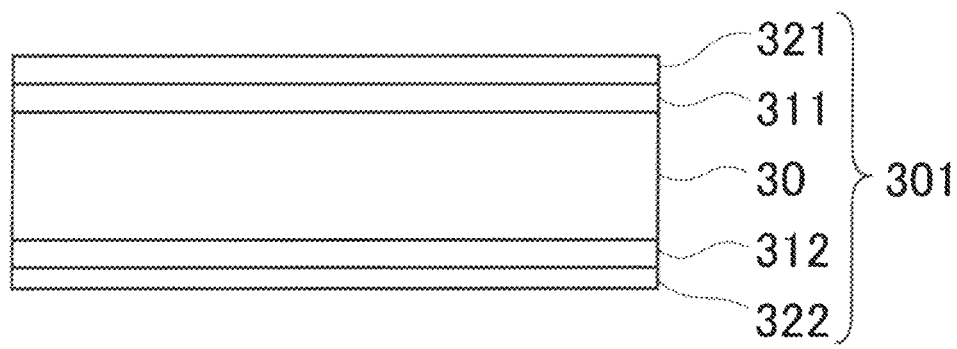
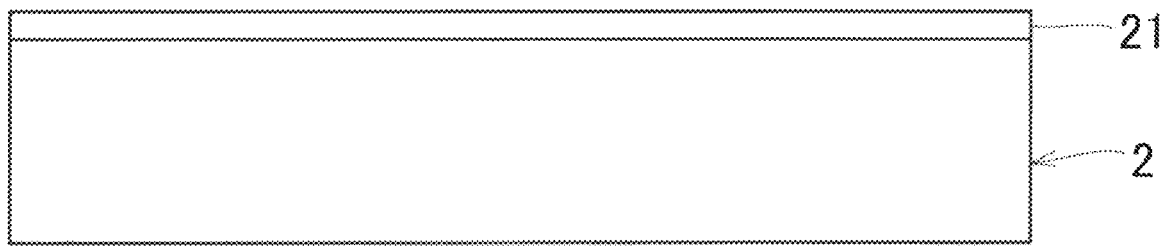
M1

FIG.1B
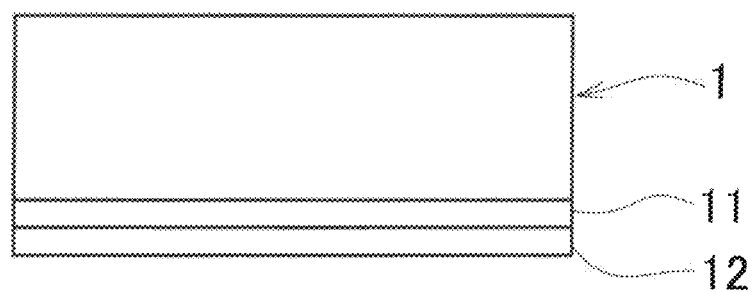
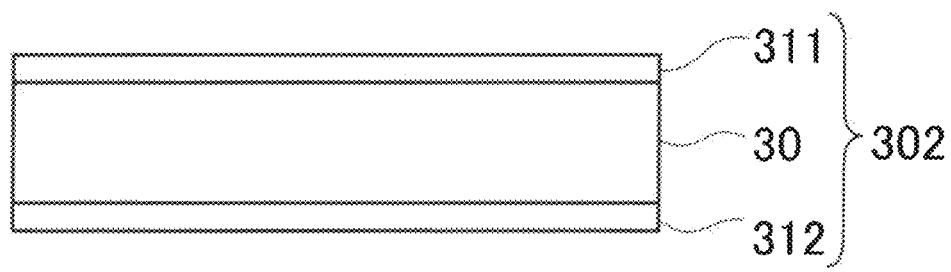
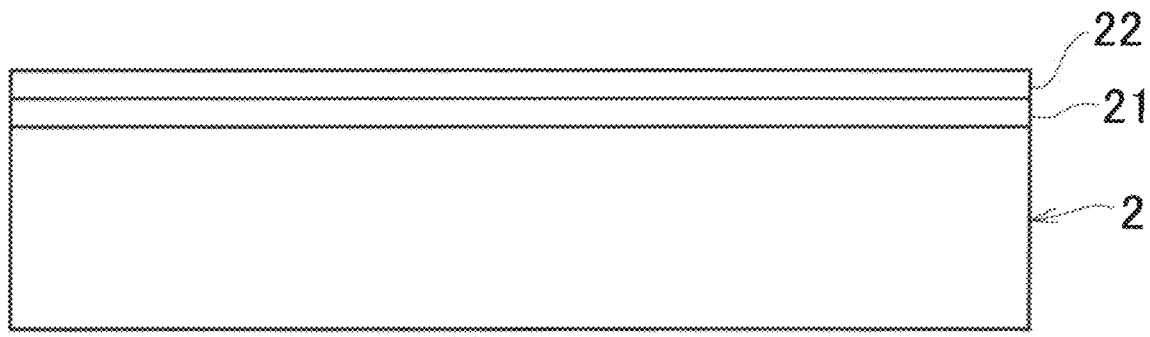
M2

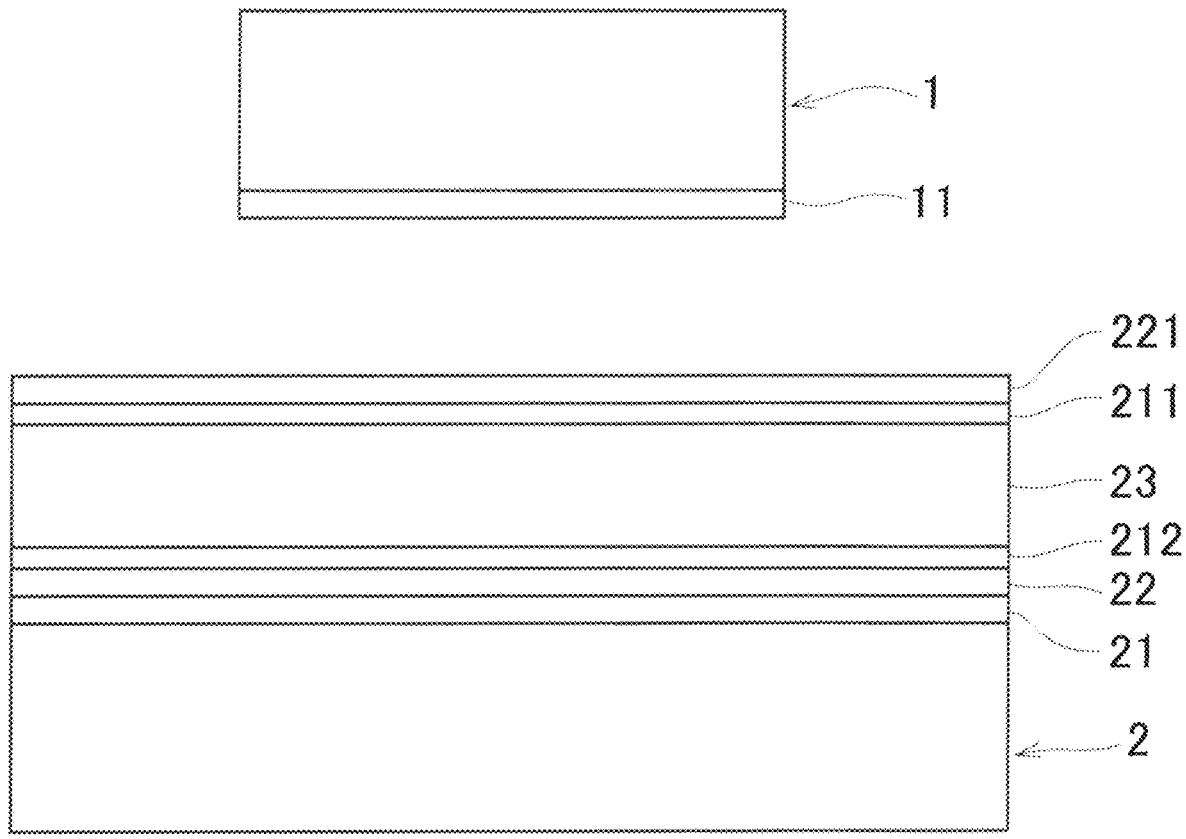

FIG.2B
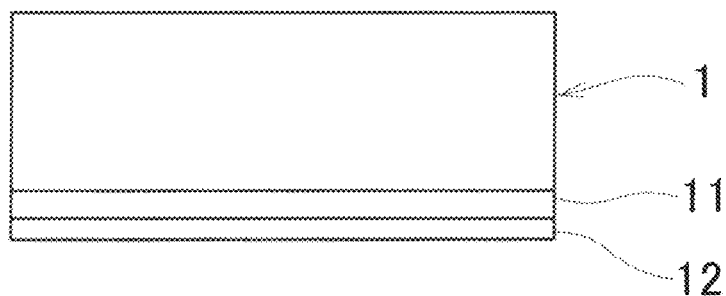
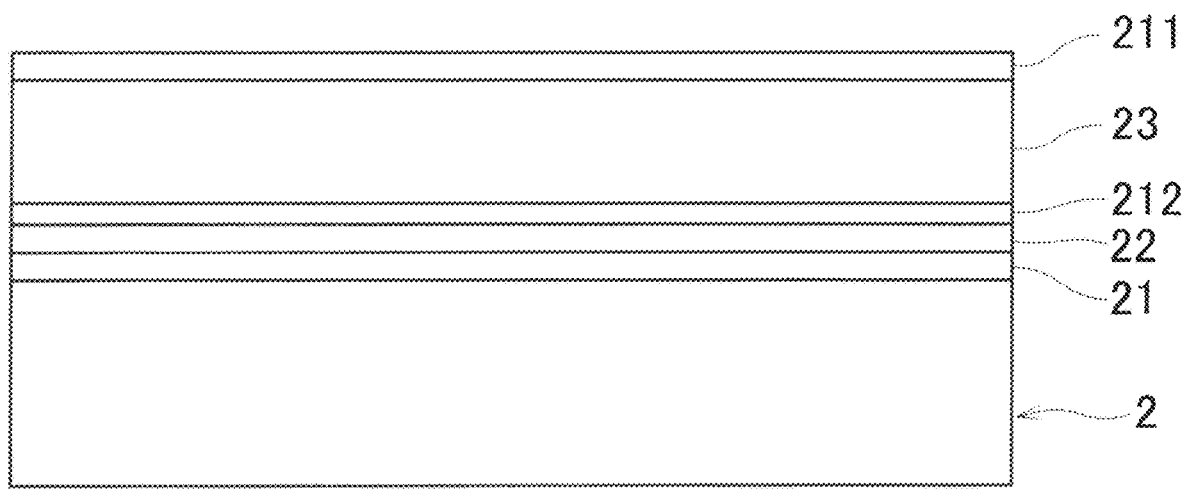
M4

FIG.3A
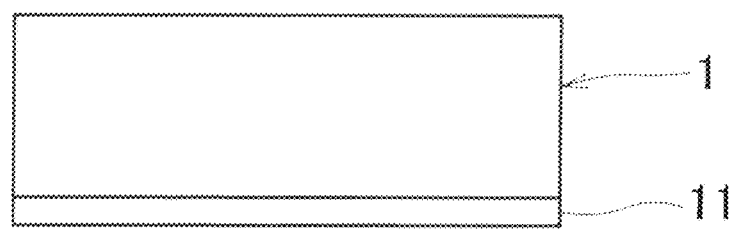
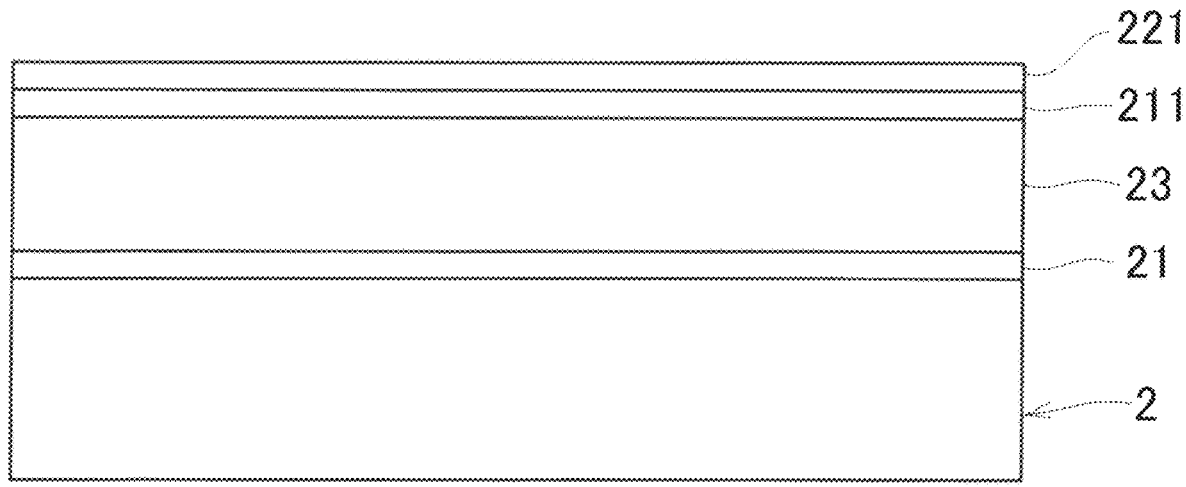
M5

FIG.3B
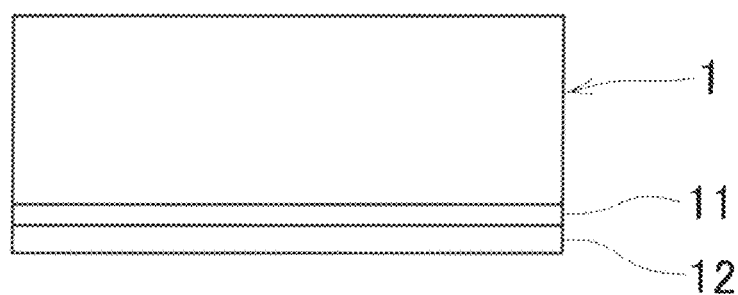
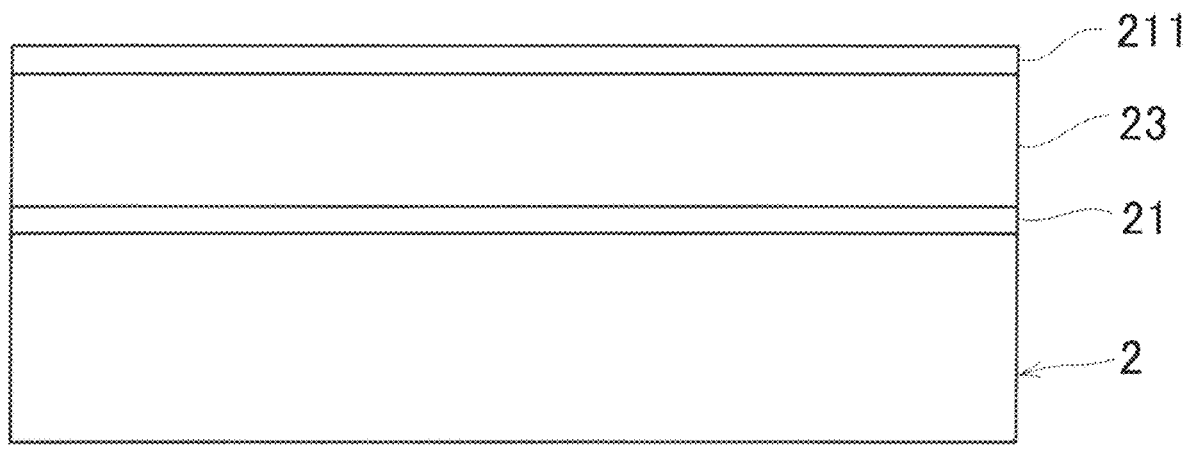
M6

| Bonding method | SLID | | Melting and solidifying | | | | Fine particle bonding |
|---|---|---|---|---|---|---|---|
| | With Al layer | No Al layer | PbSn | SnCu | SnSb | | Ag nanoparticles |
| Before test | | | | | | | |
| After test | | | | | | | |

Inside of dotted line: Bonding region (Sample 1) (Sample C1)

1 mm

Sample 1 (before test)

Sample 1 (after test)

Sample C1 (before test)

Sample C1 (after test)

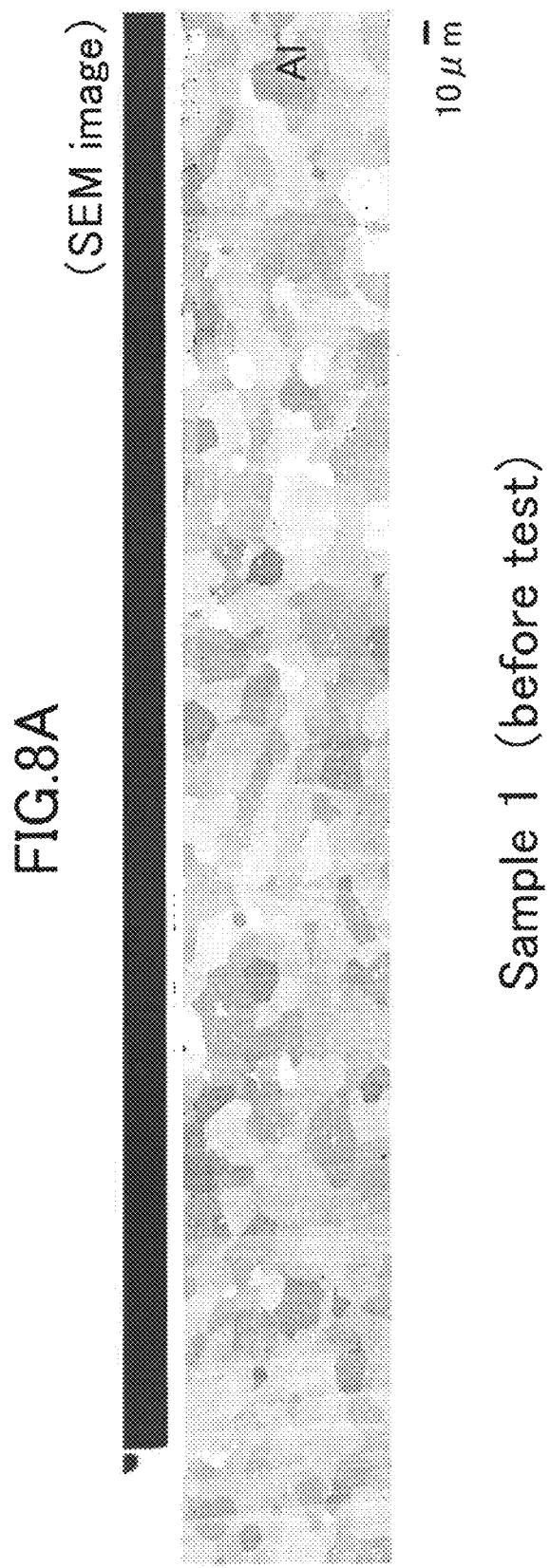

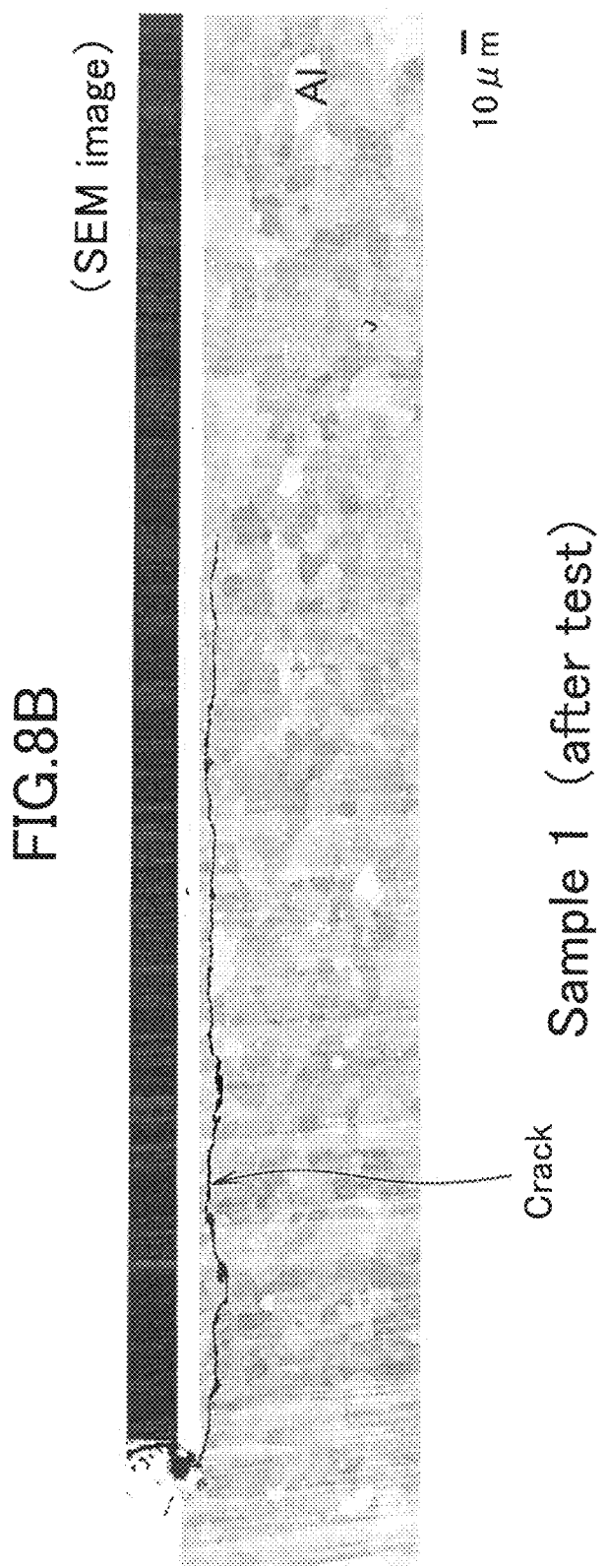

BONDED STRUCTURE AND METHOD OF MANUFACTURING THE SAME

TECHNICAL FIELD

The present invention relates to a bonded structure that exhibits high durability and reliability even when used under a high-temperature environment and/or a cooling/heating cycle and also relates to a method of manufacturing the same.

BACKGROUND ART

Power modules are used for inverters and other components for driving motors. Power modules are configured such that power devices (semiconductor elements) such as IGBTs (Insulated Gate Bipolar Transistors) are mounted on insulating multilayer substrates or metal wirings (layers) such as lead frames.

To ensure the reliability and other necessary properties of a power module, it is important that a large amount of heat generated during the operation of the power module be efficiently dissipated via a heat sink, cooler, and the like and the bonding part between members be excellent in the thermal stress relaxation characteristics and the thermal fatigue resistance characteristics.

Bonding parts between power devices and metal wirings become a considerably high temperature and receive large thermal stress depending on the difference in coefficient of thermal expansion and the temperature difference (or temperature gradient) between bonded members. In addition, the thermal stress can significantly vary in accordance with the number of cooling/heating cycles. Moreover, next-generation power devices such as those composed of SiC, GaN and $Ga_2O_3$ are expected to be used in a higher-temperature range (e.g. 150° C. or higher). Bonding parts of power modules are therefore required to have both the thermal stress relaxation characteristics and the thermal fatigue resistance characteristics at a higher level than in the prior art. When the thermal stress relaxation characteristics are excellent, the thermal stress concentration caused in bonded members can be reduced even if the temperature significantly varies. When the thermal fatigue resistance characteristics are excellent, the bonding parts will not be damaged even if significantly fluctuating thermal stress is repeatedly applied.

Solid-liquid interdiffusion bonding (simply referred to as "SLID bonding") has been proposed as one of methods for obtaining such bonding parts. In the SLID bonding, a low-melting-point metal and a high-melting-point metal are reacted to generate an intermetallic compound having a higher melting point than that of the low-melting-point metal and members are bonded to each other via the intermetallic compound. Descriptions relating to the SLID bonding are disclosed, for example, in the following patent literature.

PRIOR ART LITERATURE

Patent Literature

[Patent Literature 1] JP2006-32888A

SUMMARY OF INVENTION

Problems to be Solved by the Invention

Unlike solder bonding and other conventional bonding, the SLID bonding is innovative in that a bonding layer having a higher melting point than the bonding temperature is formed while suppressing the bonding temperature. However, a bonded member obtained by the conventional SLID bonding may be insufficient in the thermal fatigue resistance characteristics or the thermal stress relaxation characteristics because the intermetallic compound has lower toughness (or lower ductility) than the metal alone.

The present invention has been made under such circumstances and an object of the present invention is to provide a novel bonded structure that achieves both the thermal fatigue resistance characteristics and the thermal stress relaxation characteristics at a higher level while having a bonding layer composed of an intermetallic compound. Another object of the present invention is to provide a method of manufacturing the bonded structure.

Means for Solving the Problems

As a result of intensive studies and trial and error to achieve the above objects, the present inventors have successfully achieved both the thermal fatigue resistance characteristics and the thermal stress relaxation characteristics of a bonding part and therefore of a bonded structure by guiding at least a part of thermal stress acting on the bonding part to outside of a bonding layer composed of an intermetallic compound. Developing this achievement, the present inventors have accomplished the present invention which will be described below.

«Bonded Structure»

(1) The bonded structure of the present invention comprises a first member, a second member capable of being bonded to the first member, and a bonding part interposed between a first bond surface at the first member side and a second bond surface at the second member side to bond the first member and the second member. The bonding part has at least a bonding layer, a reinforcing layer, and an intermediate layer. The bonding layer is composed of an intermetallic compound and bonded to the first bond surface. The intermetallic compound is composed of a first metal and a second metal having a lower melting point than that of the first metal. The intermetallic compound has a higher melting point than that of the second metal. The reinforcing layer is composed of a third metal having higher ductility than that of the first metal. The intermediate layer is composed of the first metal and bonded to the bonding layer and the reinforcing layer. The bonding part further has a guide part composed of the intermetallic compound and provided at least at a part of an outer periphery of the bonding layer existing so as to correspond to the first bond surface. The guide part is directly connected to the reinforcing layer without via the intermediate layer.

(2) When the bonded structure of the present invention is used in a high-temperature region, even if large thermal stress acts on the bonding part between the first member and the second member and/or cyclic stress caused by the cooling/heating cycle acts on the bonding part, such as due to the difference in coefficient of thermal expansion and the temperature gradient between the first member and the second member, the bonded structure of the present invention can exhibit excellent durability or reliability.

The reason that the bonded structure of the present invention exhibits such excellent characteristics can be considered as follows. First, in the bonded structure of the present invention, the first member and the second member are bonded by the bonding layer composed of an intermetallic compound having a high melting point. The bonding part (in particular, the bonding layer) can therefore maintain a stable bonding state even under a temperature equal to or higher than the heating temperature during the bonding step, and the bonded structure of the present invention can thus be used in a high-temperature region.

On the other hand, the intermetallic compound which constitutes the bonding layer is composed of metallic elements and is excellent in the electrical conductivity, thermal conductivity, and other properties, but the intermetallic compound is hard and low in toughness (or low in ductility) because it is merely a compound. When receiving thermal shock, repeated stress, and the like, therefore, the bonding layer composed of an intermetallic compound is susceptible to damage such as cracks and breakage. In other words, the bonding layer composed merely of an intermetallic compound is inferior in the thermal shock resistance, thermal fatigue resistance characteristics, and the like. It is thus difficult to improve the durability and reliability of the conventional bonded structure with SLID bonding.

Moreover, according to the studies by the present inventors, it has been found that the bonded structure causes damage such as cracks and delamination in the vicinity of the outer peripheral side end part of the bonding part (in particular, the bonding layer) and this damage readily progresses to inside of the bonding part over time.

The bonding part of the present invention is in a state in which the bonding layer is not only composed simply of the intermetallic compound but also bonded to the reinforcing layer composed of the third metal via the intermediate layer composed of the first metal. Furthermore, the guide part, which is composed of the intermetallic compound and directly connected to the reinforcing layer, is provided in the vicinity of the outer peripheral side end part of the bonding part (in particular, the bonding layer) without via the intermediate layer.

When the bonded structure having such a bonding part is placed under a cooling/heating cycle, damage such as cracks is liable to occur at the guide part which is composed of the intermetallic compound of low toughness (or low ductility) and which is located in the vicinity of the outer peripheral side end part of the bonding part existing so as to correspond to the bond surface. In addition, even when cracks progress due to an increase in the number of cooling/heating cycles, the cracks propagate from the guide part preferentially to the reinforcing layer which is directly connected to the guide part. However, fortunately, the progression of cracks in the reinforcing layer is slow because the reinforcing layer is composed of a metal (third metal) of high ductility (high toughness). Furthermore, even if a large thermal stress acts on the bonding part, the highly ductile reinforcement layer undergoes elastic deformation, plastic deformation or the like to relax the thermal stress.

Thus, even when the bonded structure of the present invention is repeatedly used under a high-temperature environment, the guide part and the reinforcing layer effectively function and the bonding part exhibits high thermal fatigue resistance characteristics and thermal stress relaxation characteristics and can therefore exhibit excellent durability and reliability.

«Method of Manufacturing Bonded Structure»

(1) The above-described bonded structure can be obtained, for example, through the manufacturing method of the present invention as below. The manufacturing method of the present invention is a method of manufacturing a bonded structure. The method comprises a bonding step of heating a bonding material to bond a first member and a second member. The bonding material is interposed between a first bond surface of the first member and a second bond surface of the second member. The bonding material is expanded more than the first bond surface or the second bond surface. The bonding material has at least a first layer, a second layer, and a third layer. The first layer is composed of a first metal. The second layer is composed of a second metal having a lower melting point than that of the first metal. The second layer is formed on a surface of the first layer located at the first bond surface side. The third layer is composed of a third metal having higher ductility than that of the first metal. The third layer is formed on the other surface of the first layer. The bonding step is a step of leaking a melt of the second metal to at least a part on the first layer located at an outer peripheral side of the first bond surface and heating the bonding material to a temperature equal to or higher than a reaction temperature that allows an intermetallic compound to be generated between the second metal and the first metal.

(2) According to the manufacturing method of the present invention, the above-described bonded structure can be efficiently obtained. Specific description will be presented below. First, a state is made in which at least the first layer composed of the first metal, the second layer composed of the second metal, and the third metal composed of the third metal are interposed between the first bond surface of the first member and the second bond surface of the second member (interposing step or arranging step). The bonding material (and the first member and the second member between which the bonding material is interposed) in this state is heated to a temperature equal to or higher than the melting point of the second metal (further, more than its melting point), which temperature is a temperature (reaction temperature) that allows the intermetallic compound composed of the first metal and the second metal to be generated. Through this heating, the previously-described bonding layer composed of the intermetallic compound is formed. At this time, a remaining part in the first layer that does not contribute to the generation of the intermetallic compound becomes the intermediate layer. The third layer ordinarily becomes the reinforcing layer without any change.

The reaction temperature at which the intermetallic compound is generated is ordinarily higher to some extent than the melting point of the second metal, and the second metal of the second layer does not become an intermetallic compound immediately after melting. Accordingly, during the period in which the heating temperature for the bonding step reaches the reaction temperature of the intermetallic compound from the melting point of the second metal, the second layer (the second metal) comes to a liquid-phase state between the first layer and the first bond surface. In many cases, the liquid phase is in a state of being pressurized to a greater or lesser extent by the own weight of the first member and the like or the manufacturing apparatus and the like.

As a result, in the liquid phase of the second metal, an excess portion that does not contribute to the formation of the bonding layer leaks out to the outer peripheral side of the bonding interface (outer peripheral side of the bonding layer) in accordance with the liquid phase amount and the pressurization amount. The leaked liquid phase of the second metal flows out onto the first layer, which is expanded more than the first bond surface, and comes to a state of being accumulated at the end part of the outer peripheral side of the first bond surface. When, in this state, the heating temperature reaches the reaction temperature, the leaked liquid phase of the second metal reacts with the first metal of the first layer to become an intermetallic compound. As the reaction progresses sufficiently, the first layer located in the vicinity of the end part of the outer peripheral side of the first bond surface is consumed and disappears (changes to an intermetallic compound), and a guide part is formed which is directly connected to the third layer (reinforcing layer) without via the first layer (intermediate layer). Thus, the bonding layer and the guide part each composed of the intermetallic compound are formed almost at the same time. The generation reaction of the intermetallic compound is a solid-liquid interdiffusion reaction, and the melting point of the intermetallic compound is higher than the reaction temperature (heating temperature during the bonding step). The intermetallic compound therefore becomes a solid phase simultaneously with the generation even without cooling.

The width (thickness) of the bonding layer, the size of the guide part, and other parameters can be easily adjusted by controlling not only the thickness of the second layer but also the amount of pressurization between the bonding interfaces. In this regard, the bonding step according to the present invention preferably includes a step of controlling the pressurization amount. Control of the pressurization amount can be easily performed, for example, by adjusting the load applied between the first member and the second member, etc.

(3) The bonding material is expanded to some extent than the bonding interface (bonding surface). This allows not only the guide part to be formed as described above but also allows the bond surface as a whole to be stably bonded even if there are some positional deviations, dimensional changes and the like before the bonding step or during the bonding step.

The bonding step can be carried out, provided that at least the first layer to the third layer exist between the first bond surface and the second bond surface. All or a part of these layers before the bonding step may exist in a state of being separated from the first member or the second member or may also be preliminarily provided at the first bond surface side or the second bond surface side. In an embodiment, therefore, at least a part of the bonding material according to the present invention may comprise a laminated material in which two or more of the first layer, the second layer, and the third layer are laminated. In another embodiment, at least one of the first layer, the second layer, and the third layer may be preliminarily formed at the first bond surface side or the second bond surface side before the bonding step.

(4) In addition to the above-described method, a method for obtaining the guide part may be employed in which, for example, a paste of the second metal is attached or applied to the outer peripheral side of the first bond surface and then heated at the previously-described reaction temperature. The bonding step in this case may be a step that includes attaching the second metal to at least a part on the first layer located at the outer peripheral side of the first bond surface and heating the second metal to a temperature equal to or higher than a reaction temperature that allows the second metal to melt and allows an intermetallic compound to be generated between the molten second metal and the first metal.

(5) It may be considered that the first layer (intermediate layer) composed of the first metal, which is generally lower in ductility and higher in strength than the third metal constituting the third layer (reinforcing layer), not only reacts with the second layer composed of the second metal to generate an intermetallic compound but also acts as follows to contribute to improvement of the thermal fatigue resistance characteristics and the like of the bonding part. First, during the bonding, the first layer remains and becomes an intermediate layer thereby to suppress the reaction between the second metal of the second layer and the third metal of the third layer, and unexpected intermetallic compounds and the like, which have a low melting point or are brittle, can be prevented from being formed on the third layer (reinforcing layer). Appropriate selection of the first metal and the third metal allows the first layer and the third layer to stably exhibit high interfacial adhesion, and delamination and the like at the interface between both layers are less likely to occur even in a high-temperature region. Thus, the intermediate layer also contributes to the improvement of the thermal fatigue resistance characteristics and the like of the bonded structure of the present invention.

«Others»

(1) In the present description, the designation of first, second or third is used for descriptive purposes, and the case in which the bonding layer is formed at the first bond surface side is described. The second bond surface side may have a bonded structure similar to that of the first bond surface side or may also have a different bonded structure. When bonding parts having similar structures are provided at the first bond surface side and the second bond surface side, the intermediate layer and the bonding layer are formed in this order at each of both surface sides of the reinforcing layer. In this case, for example, a bonding material (laminated material) can be used in which the first layer and the second layer are formed in this order at each of both surface sides of the third layer.

(2) It is preferred that another first metal layer (such as a covering layer) be also formed at the bond surface side to be bonded by the intermetallic compound. This achieves a state in which both surfaces of the second layer (second metal layer) are sandwiched by the first metal layers, and the bonding due to generation of the intermetallic compound is ensured.

(3) The bonded structure of the present invention is effective when at least the temperature of the first member becomes high, because the bonded structure is excellent in the thermal shock resistance, thermal fatigue resistance characteristics, thermal stress relaxation characteristics, and other properties. More specifically, the bonded structure of the present invention is effective when the first bond surface at the first member side has a smaller coefficient of thermal expansion than that of the second bond surface at the second member side. Examples of such a first member include semiconductor elements (heat generation sources) which have small coefficients of thermal expansion and become high temperatures. On the other hand, examples of the second member include metal wirings (such as lead frames and wirings on insulating substrates) which have large coefficients of thermal expansion and are used at the heat dissipation side (low-temperature side).

(4) Strength, ductility or toughness referred to in the present description is determined in accordance with Japanese Industrial Standards (JIS). Specifically, ductility is determined on the basis of the amount of plastic deformation (strain amount) from the yield point to the fracture in the stress-strain curve diagram. Toughness is determined on the basis of the impact absorption energy in the Charpy impact test. This impact absorption energy generally corresponds to an area that is surrounded by the curve from the yield point to the fracture and the horizontal axis (strain) in the stress-strain curve diagram. In the present description, therefore, toughness is determined by the impact absorption energy thus obtained. Strength is determined by nominal stress at the fracture (breakage). All of them are characteristics in the room-temperature region.

The third metal has higher ductility than that of the first metal, but may preferably have a lower Young's modulus (longitudinal elastic modulus/room temperature region) than that of the first metal. As the reinforcing layer is composed of the third metal having a low Young's modulus, it is possible to reduce the thermal stress acting between the first member and the second member and the residual stress introduced during the bonding. In general, a metal having a low Young's modulus has high ductility or high toughness and is suitable for the reinforcing layer (third layer).

(5) Unless otherwise stated, a numerical range "x to y" as referred to in the present description includes the lower limit value x and the upper limit value y. Various numerical values or any numerical value included in numerical ranges described in the present description may be selected or extracted as a new lower limit value or upper limit value, and any numerical range such as "a to b" may thereby be newly provided using such a new lower limit value or upper limit value.

BRIEF DESCRIPTION OF DRAWINGS

FIG. 1A is a schematic view illustrating a first form before bonding of a power module that is an example of a bonded structure.

FIG. 1B is a schematic view illustrating a second form before bonding of the power module.

FIG. 2A is a schematic view illustrating a third form before bonding of the power module.

FIG. 2B is a schematic view illustrating a fourth form before bonding of the power module.

FIG. 3A is a schematic view illustrating a fifth form before bonding of the power module.

FIG. 3B is a schematic view illustrating a sixth form before bonding of the power module.

FIG. 8A is a SEM image representing the cross section in the vicinity of a bonding layer of Sample 1 before the test.

FIG. 8B is a SEM image representing the cross section in the vicinity of the bonding layer of Sample 1 after the test.

EMBODIMENTS FOR CARRYING OUT THE INVENTION

Figure 4:
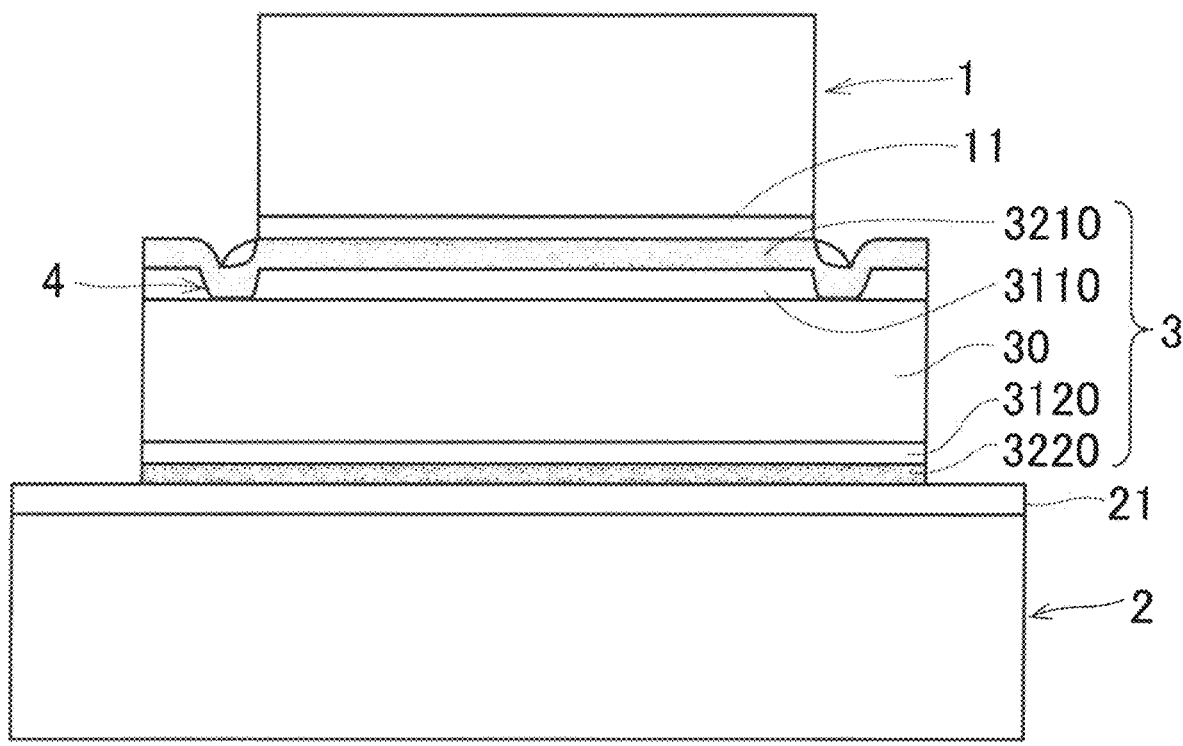
FIG. 4 is a schematic view illustrating a form after bonding of a power module.

The contents described in the present description can be applied not only to the bonded structure of the present invention but also to a method of manufacturing the bonded structure. One or more features freely selected from the present description can be added to the above-described features of the present invention. Features regarding a "method" can also be features regarding a "product." Which embodiment is the best or not is different in accordance with objectives, required performance, and other factors.

First Metal and Second Metal

Various metals are conceivable as the first metal to be the first layer or the intermediate layer and as the second metal to generate the intermetallic compound (single phase) with the first metal. The combination of the first metal and the second metal is selected with consideration for the heat resistant temperature of the bonded structure, the heating temperature region during the bonding step, the coefficient of thermal expansion, and other necessary properties.

Examples of the first metal include Ni, Cu, Ti, Mo, W, Si, Cr, Mn, Co, Zr, Nb, Ta, Ag, Au, Pt, and alloys thereof. Examples of the second metal include In, Ga, Pb, Bi, Zn, and alloys thereof. For example, the first metal may be nickel (Ni) and the second metal may be tin (Sn). The melting point of Sn is about 230° C. and the melting point of Ni is about 1,450° C. When an Ni layer (first layer or intermediate layer) and an Sn layer (second layer) are heated, for example, at about 350° C. for about 15 minutes while being in contact with each other, a single phase of an intermetallic compound referred to as nickel tin (NiSn) is obtained. The melting point of this intermetallic compound is about 795° C.

The combination of the first metal of Ni and the second metal of Sn is effective, for example, when the heat resistance is required to be 150° C. or higher while the heating temperature during the bonding step is required to be 400° C. or lower, such as when a power module (bonded structure) is manufactured using a next generation semiconductor element (first member) composed of SiC or the like.

Other examples of the combination of first metal/second metal include Ni/Sn, Cu/Sn, Ag/Sn, Pt/Sn, and Au/Sn. The first metal which constitutes the intermediate layer (first layer) is preferably the same as the metal (or coating metal) which forms the first bond surface. In this case, the first bond surface and the intermediate layer together generate an intermetallic compound with the second metal and are strongly bonded to each other. In many cases, a coating layer (plating layer) composed of Ni (first metal) is formed, for example, on the (rear surface) electrode and the like of a semiconductor element.

Third Metal

Various metals are conceivable also as the third metal to be the third layer or the reinforcing layer and can be appropriately selected in accordance with the type of the first metal and the required spec of the bonded structure. As described above, the third metal preferably has high ductility and low Young's modulus.

The reinforcing layer is preferably thicker than the intermediate layer and the like in order to ensure the durability of the bonded structure, but as the reinforcing layer becomes thick, the heat transfer resistance and electric resistance can increase. Accordingly, the third metal which constitutes the reinforcing layer is preferably excellent in the thermal conductivity and the electrical conductivity. Also from such a viewpoint, the third metal is preferably aluminum (Al), copper (Cu), or an alloy thereof.

Guide Part

It suffices that the guide part is present at least at a part of the outer peripheral side end part of the bonding part (in particular, the bonding layer) at which thermal stress tends to concentrate and which is liable to trigger the fatigue fracture, but the guide part is more preferably formed along the entire circumference. The guide part as a whole is preferably an intermetallic compound (single phase), but the second metal may remain to some extent in the guide part. It suffices that the guide part is present at the outer peripheral side of the first bond surface and at the outer peripheral side of the bonding layer which is bonded to the first bond surface, and an intermetallic compound layer or the like may further exist at the outer peripheral side of the guide part (See FIG. 4).

Bonding Step

The bonding step is a step of forming the bonding layer and the guide part which are composed of an intermetallic compound. Specifically, the bonding step is a step of heating the first metal of the first layer and the second metal of the second layer at a reaction temperature at which the intermetallic compound is formed. The intermetallic compound is a resulting material of an interdiffusion reaction between the solid phase of the first metal and the liquid phase of the second metal and, therefore, the heated state is preferably held for a certain period of time.

The reaction temperature and the holding time are different depending on the types of the first metal and the second metal, but may be set as below. The reaction temperature may be set within a temperature range lower than the heat resistant temperature of the member to be bonded (such as an element) and at a temperature that is equal to or higher than the melting point of the second metal and equal to or higher than the temperature at which the intermetallic compound is formed. The holding time may be set as a time in which the intermetallic compound of an amount required for the formation of the bonding layer is formed. In an embodiment, the thicknesses of the first metal (layer) and second metal (layer) and the amount of pressure applied between these layers can be controlled thereby to adjust the thickness of the bonding layer composed of the intermetallic compound, the size of the guide part (the amount of leakage of the molten second metal), and the like.

Form of Bonded Structure

Various forms of the bonded structure of the present invention are conceivable. Here, specific exemplary forms of a power module (bonded structure) will be described in which a semiconductor element (the first member or the second member) is mounted on a metal wiring (the second member or the first member) of a laminated insulating substrate. To clarify the differences in these forms, the state before bonding will be mainly described.

It is assumed that the following points are common in all the forms. The semiconductor element is a power device, such as an IGBT, which is composed of SiC, and has a back electrode (first bond surface) formed with metalized Ni (first metal) or the like. The laminated insulating substrate is a DBC (Direct Brazed Copper) substrate in which a Cu layer (metal wiring) is directly laminated on a ceramic layer such as an AlN layer, a DBA (Direct Brazed Aluminum) substrate in which an Al layer (metal wiring) is directly laminated on a ceramic layer such as an AlN layer, or the like. Another metal wiring (second member) is also composed of such a Cu layer or Al layer. This metal wiring has a wiring electrode (second bond surface) formed with metalized Ni or the like as in the back electrode of the semiconductor element. The back electrode and the wiring electrode are thus formed with metalized Ni or the like thereby to improve the wettability with the second metal (second layer), Sn solder, and the like.

(1) FIG. 1A illustrates a power module M1 before bonding. The power module M1 is manufactured from a semiconductor element 1 formed with a back electrode 11, a metal wiring 2 formed with a wiring electrode 21, and a laminated sheet 301 (bonding material, laminated material). The laminated sheet 301 has a layer 30 (third layer) composed of pure Al or the like (third metal), layers 311 and 312 (first layers) composed of Ni or the like and formed at both surface sides of the layer 30, and layers 321 and 322 (second layers) composed of Sn or the like (second metal) and each formed at one surface side of the layer 311 or 322. The laminated sheet 301 is expanded to the outer peripheral side from the back electrode 11. The area of the laminated sheet 301 is slightly larger than the area of the back electrode 11, but may be smaller than the area of the wiring electrode 21. The same applies to other power modules which will be described later.

Mounting (bonding) is performed as follows. First, the laminated sheet 301 is interposed between the semiconductor element 1 and the metal wiring 2. The body thus obtained by interposition is put into a heating furnace composed of a desired atmosphere such as an inert atmosphere (including a vacuum atmosphere) or an active atmosphere (such as a hydrogen atmosphere and a formic acid reductive atmosphere), heated to a predetermined reaction temperature, and held for a certain period of time. In the process of raising the temperature, the layer 321 interposed between the back electrode 11 and the layer 311 and the layer 322 interposed between the wiring electrode 21 and the layer 312 melt first. At this time, at least the molten metal (second metal) originated from the layer 321 seeps out to the outer peripheral end side of the back electrode 11 and the layer 311 and leaks on the layer 311 (first metal) to be accumulated.

When the temperature is further raised to reach the reaction temperature, the molten metal originated from the layer 321 reacts with the back electrode 11 and the layer 311 (solid-liquid interdiffusion reaction) to become an intermetallic compound. Likewise, the molten metal originated from the layer 322 also reacts with the wiring electrode 21 and the layer 312 to become an intermetallic compound. This results in a state in which the back electrode 11 and the layer 311, and the wiring electrode 21 and the layer 312, are strongly bonded to each other via the newly generated intermetallic compound layers (bonding layers). As will be understood, the layer 311 (or the layer 312) remaining after the generation of the intermetallic compound becomes the intermediate layer referred to in the present invention, and the layer 30 becomes the reinforcing layer.

It may be conceivable that the thicknesses of the layers 321 and 322 (the amount of the second metal) and the like are adjusted to generate the intermetallic compounds (bonding layers) to such an extent that the layers 311 and 312 (and therefore the metal layers of the back electrode 11 and wiring electrode 21) substantially disappear. However, if the second metal composed of the layers 321 and 322 remains between the bonding interfaces, the second metal may re-melt or react with the third metal, which constitutes the layer 30, to newly generate another brittle intermetallic compound. This may not be preferred. From such a viewpoint, the layers 311 and 312 (and therefore the metal layers of the back electrode 11 and wiring electrode 21) are made to remain even after the bonding step.

The liquid-phase second metal, which leaks out from between the back electrode 11 and the layer 311 and accumulates on the layer 311, also reacts with the layer 311 to become an intermetallic compound. In this case, the layer 311 in the region on which the molten metal accumulates is completely consumed for generation of the intermetallic compound and disappears, and the generated intermetallic compound will be in a state of being directly connected to the layer 30 (third metal) without via the layer 311. The guide part referred to in the present invention is thus formed. The melting amount (leakage amount) of the second metal necessary for the formation of the guide part can be controlled by adjusting the thickness of the layer 321, the amount of pressure applied between the semiconductor element 1 and the metal wiring 2, and the like.

FIG. 4 illustrates the power module M1 thus obtained after bonding. This power module M1 has a structure in which the semiconductor element 1 and the metal wiring 2 are bonded via the bonding part 3. The same members or parts as those illustrated in FIG. 1A are denoted with the same reference numerals.

The bonding part 3 comprises a reinforcing layer 30 (layer 30) located at the middle, intermediate layers 3110 and 3120 located at both surface sides of the reinforcing layer 30, and bonding layers 3210 and 3220 located at both sides of the intermediate layers 3110 and 3120. The intermediate layers 3110 and 3120 are composed of remaining parts of the layers 311 and 312. The bonding layers 3210 and 3220 are composed of an intermetallic compound formed by the reaction between the first metal of the layers 311 and 312 and the second metal of the layers 321 and 322. The bonding layer 3210 bonds the back electrode 11 and the intermediate layer 3110 which remain after the reaction. The bonding layer 3220 bonds the wiring electrode 21 and the intermediate layer 3120 which remain after the reaction. The semiconductor element 1 and the metal wiring 2 are thus bonded via the bonding part 3. In addition, a guide part 4 composed of the same intermetallic compound as the bonding layer 3210 is provided at the outer peripheral end part of the bonding part 3 (in particular, the bonding layer 3210) in a state of being directly connected to the reinforcing layer 30 located at the outer peripheral side of the bonding part 3.

(2) FIG. 1B illustrates a power module M2 of another form before bonding. The same members and the like as those of the power module M1 are denoted with the same reference numerals, and the detailed description will be omitted (here and hereinafter).

The power module M2 is manufactured from a semiconductor element 1 in which a layer 12 composed of the second metal is formed on a back electrode 11, a metal wiring 2 in which a layer 22 composed of the second metal is formed on a wiring electrode 21, and a laminated sheet 302. The laminated sheet 302 has layers 311 and 312 that are composed of the first metal and formed on both surface sides of the layer 30. The power module M2 is configured such that the layer 321 and the layer 322 of the power module M1 are respectively provided as the layer 12 at the semiconductor element 1 side and the layer 22 at the metal wiring 2 side. The power module M2 thus obtained is in the same form as the power module M1.

(3) FIG. 2A illustrates a power module M3 of another form before bonding. The power module M3 is manufactured from a metal wiring 2 in which a layer 22 composed of the second metal, a layer 212 composed of the first metal, a layer 23 composed of the third metal, a layer 211 composed of the first metal, and a layer 221 composed of the second metal are laminated on a wiring electrode 21 in this order and a semiconductor element 1 having a back electrode 11. In this form, each layer that constitutes the laminated sheet 301 used for manufacturing the power module M1 is preliminarily formed at the metal wiring 2 side. The power module M3 thus obtained is also in the same form as the power module M1.

(4) FIG. 2B illustrates a power module M4 of another form before bonding. In this form, the layer 221 of the power module M3 is formed as a layer 12 on a back electrode 11 of a semiconductor element 1.

(5) FIG. 3A illustrates a power module M5 of another form before bonding. The power module M5 is manufactured from a metal wiring 2 in which a layer 23 composed of the third metal, a layer 211 composed of the first metal, and a layer 221 composed of the second metal are laminated on a wiring electrode 21 in this order and a semiconductor element 1 having a back electrode 11. This form is different from the power modules M3 and M4 in that the layer 22 composed of the second metal and the layer 212 composed of the first metal, which are formed at the metal wiring 2 side, are omitted. That is, this form represents a case in which the layer 23 composed of the third metal is bonded directly to the wiring electrode 21, such as by clad bonding, without via a bonding layer composed of an intermetallic compound.

(6) FIG. 3B illustrates a power module M6 of another form before bonding. In this form, the layer 221 of the power module M5 is formed as a layer 12 on a back electrode 11 of a semiconductor element 1.

Thus, various forms are conceivable as the bonded structure of the present invention, but it suffices that there are at least a bonding layer composed of the intermetallic compound (single phase) and a guide part in which the intermetallic compound is connected directly to a reinforcing layer.

Each metal layer referred to in the present description may be formed by any method such as rolling (cladding), metallization (vapor deposition), attaching, and the like. The semiconductor element may be composed not only of SiC but also of Si, GaN, $Ga_2O_3$, or the like. Moreover, the object material on Which the semiconductor element is mounted is not limited to the above-described substrate and may also be a lead frame or the like. When using an insulating substrate, the ceramic layer is preferably composed of a material having excellent thermal conductivity, such as AlN, $Si_3N_4$, and $Al_2O_3$. As will be understood, a metal substrate may also be used. The semiconductor module may preferably be provided with a heat transfer device (heat dissipation device), such as a heat sink, a heat spreader, and a cooler in which a refrigerant circulates.

Examples

Samples (power modules) of SLID bonding were produced and their thermal fatigue resistance characteristics and thermal stress relaxation characteristics were actually evaluated. Contents of the present invention will be specifically described based on such examples.

Sample

The power module M1 illustrated in FIG. 4 was actually produced. Materials were as follows: the semiconductor element 1: SiC chip, the metal wiring 2: copper wiring, the first metal: Ni, the second metal: Sn, and the third metal: Al. Sizes of respective parts were as follows: the back electrode 11: 5×5 mm, the laminated sheet 301: 7×7 mm, and the wiring electrode 21: 20×20 mm. Thicknesses of respective layers constituting the laminated sheet 301 were as follows:

the layer 30 (Al layer): 100 μm, the layers 311 and 312 (Ni layers): 3 μm, the layer 321 (Sn layer): 5 μm, and the layer 322 (Sn layer): 5 μm.

The semiconductor element 1 and the metal wiring 2 (substrate) sandwiching the laminated sheet 301 therebetween were put into a heating furnace, heated to 350° C. (reaction temperature) in a hydrogen or nitrogen atmosphere, and then held at 350° C. for 15 minutes. This heating treatment (bonding step) was performed while applying 0.5 MPa between the semiconductor element 1 and the metal wiring 2 (between the bonding interfaces). Thereafter, the sample was naturally cooled and taken out from the furnace.

Test

A cooling/heating cycle test was performed such that the obtained sample (referred to as "Sample 1") was repeatedly exposed to a high-temperature environment (200° C.) and a low-temperature environment (−40° C.). The number of cycles in this test was 500 times.

Observation (1) The state of the bonding part was observed using an ultrasonic microscope before and after the cooling/heating cycle test.

For comparison, another sample (referred to as "Sample C1") was also prepared using a laminated sheet in which the layer 30 (Al layer) was omitted. Sample C1 was obtained such that the back electrode 11 of the semiconductor element 1 and the wiring electrode 21 of the metal wiring 2 were bonded to each other. In addition, samples of bonding obtained by melting and solidifying solders composed of various conventional alloys were also prepared. Further, a sample of bonding obtained using fine particles (Ag nanoparticles) was also prepared. The fine particles start melting at a temperature lower than the original melting point of the metal. For reference, combinations of melting point/heating temperature for bonding of respective bonding materials are as follows: PbSn: 302° C./352° C., SnCu: 227° C./277° C., SnSb: 232° C./272° C., and Ag nanoparticles: 962° C./350° C. Only when the Ag nanoparticles are used, (melting point)>(heating temperature) is established.

For each of the above-described comparative samples, the bonding part was also observed using an ultrasonic microscope. Photomicrographs of respective bonding parts thus obtained are presented in FIG. 5.

(2) For Sample 1 and Sample C1, cross sections around the bonding parts before and after the cooling/heating cycle test were observed using a scanning electron microscope (SEM). The appearance of Sample 1 before the test is presented in FIG. 6A and the appearance after the test is presented in FIG. 6B (both figures are also simply referred to as "FIG. 6"). The appearance of Sample C1 before the test is presented in FIG. 7A and the appearance after the test is presented in FIG. 7B (both figures are also simply referred to as "FIG. 7").

(3) For Sample 1, the vicinity of the bonding layer before and after the cooling/heating cycle test was observed using a SEM. The SEM image before the test is presented in FIG. 8A and the SEM image after the test is presented in FIG. 8B (both figures are also simply referred to as "FIG. 8").

Measurement

For each of Sample 1, Sample C1, the sample of bonding obtained using the PbSn solder, the sample of bonding obtained using the SnCu solder, and the sample of bonding obtained using the SnSb solder, the maximum stress acting on the semiconductor element 1 (measurement site: the central part of the element) during the cooling/heating cycle test was measured using a strain gauge built in the semiconductor element 1. The results obtained for the samples are collectively illustrated in FIG. 9.

Figure 5:
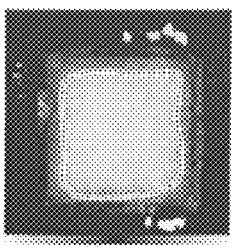
FIG. 5 is a set of ultrasonic microscopic image photographs each representing the appearance of a bonding part after a cooling/heating cycle test for each sample.

Evaluation (1) As apparent from FIG. 5, even after such a severe cooling/heating cycle test, only Sample 1 (SLID, with Al layer) according to the present invention maintains almost the same state as before the test. With regard to the comparative samples, attention is first focused on Sample C1 (SLID, no Al layer). Sample C1 is also obtained by bonding via the formation of an intermetallic compound (SLID bonding) as in Sample 1, but as apparent from FIG. 5, it can be found that the bonding state after the test significantly changes and the bonding area decreases to a large extent.

Figure 7A:
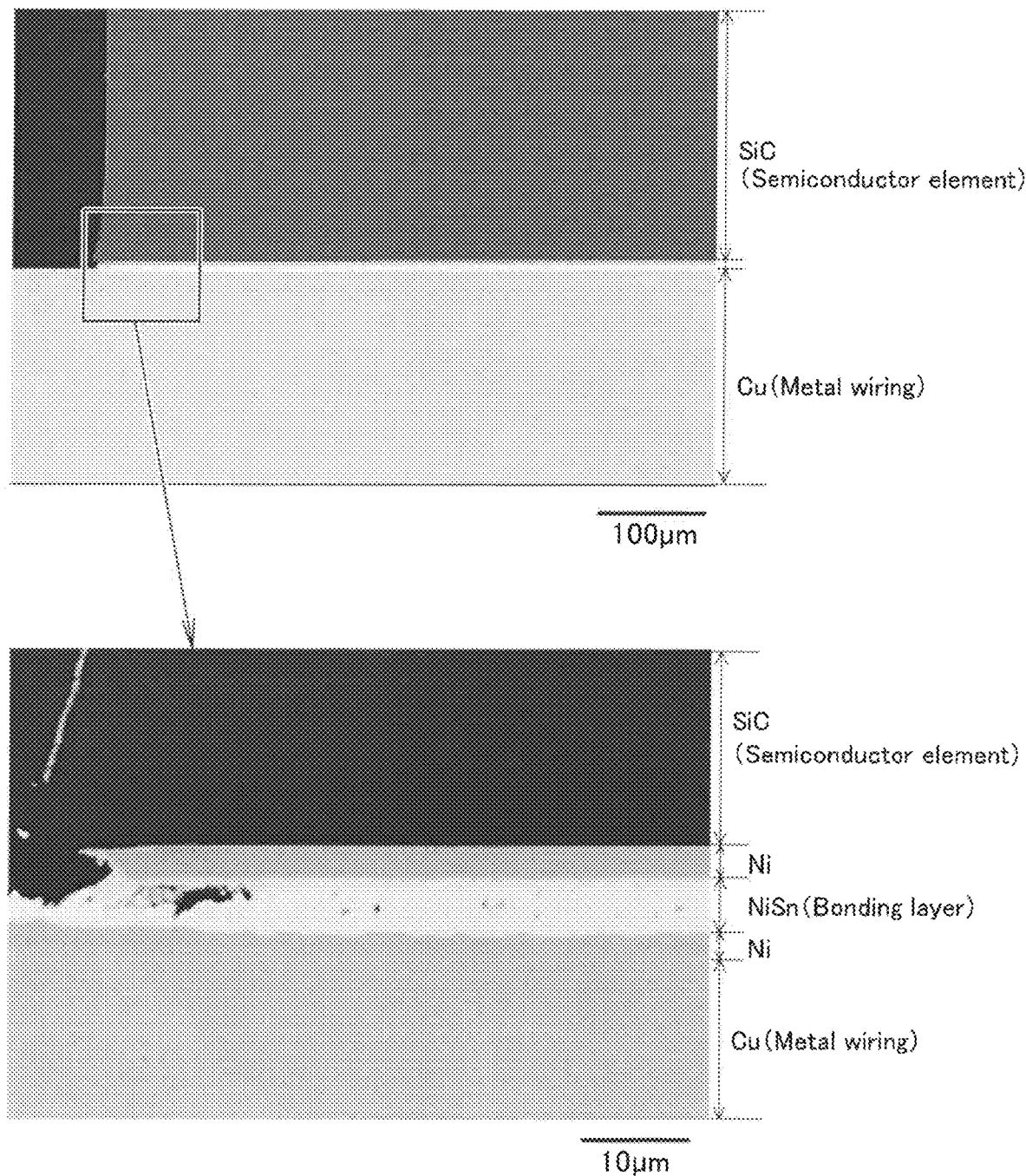
FIG. 7A is a set of SEM images representing the cross section of a bonding part of Sample C1 before the test.
Figure 7B:
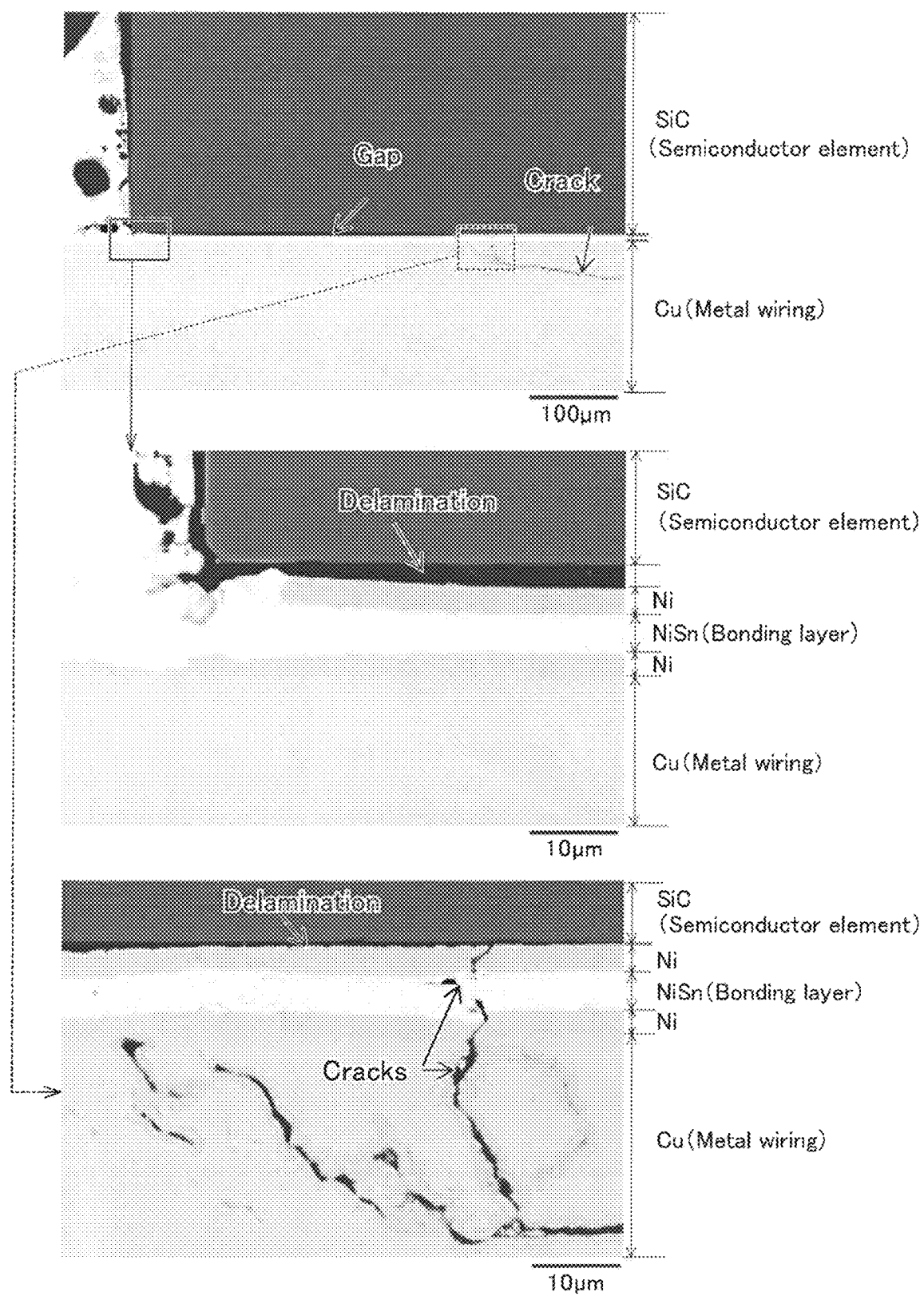
FIG. 7B is a set of SEM images representing the cross section of the bonding part of Sample C1 after the test.

This is also apparent from comparison between FIG. 7A and FIG. 7B which relate to Sample C1. That is, in Sample C1 after the test, delamination occurs at the bonding interface and cracks are generated in the bonding layer. In addition, the cracks reach the metal wiring 2 (Cu layer) which is a bonded member, and the vicinity of the bonding part is considerably damaged.

Figure 6A:
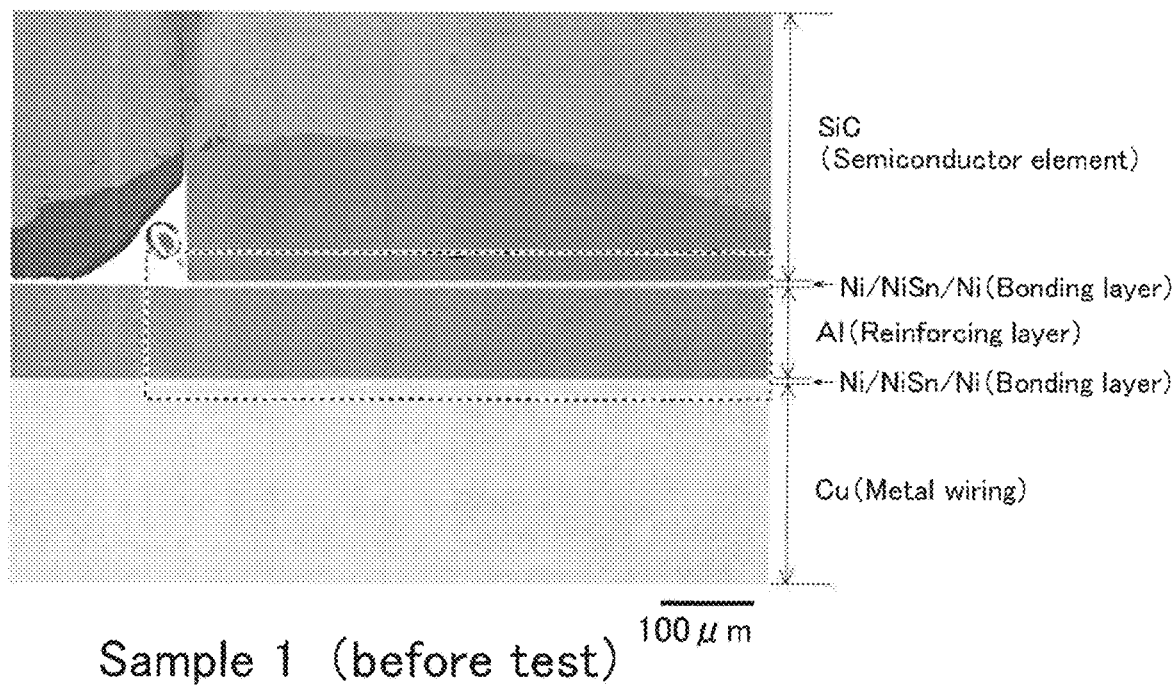
FIG. 6A is a SEM image representing the cross section of a bonding part of Sample 1 before the cooling/heating cycle test.
Figure 6B:
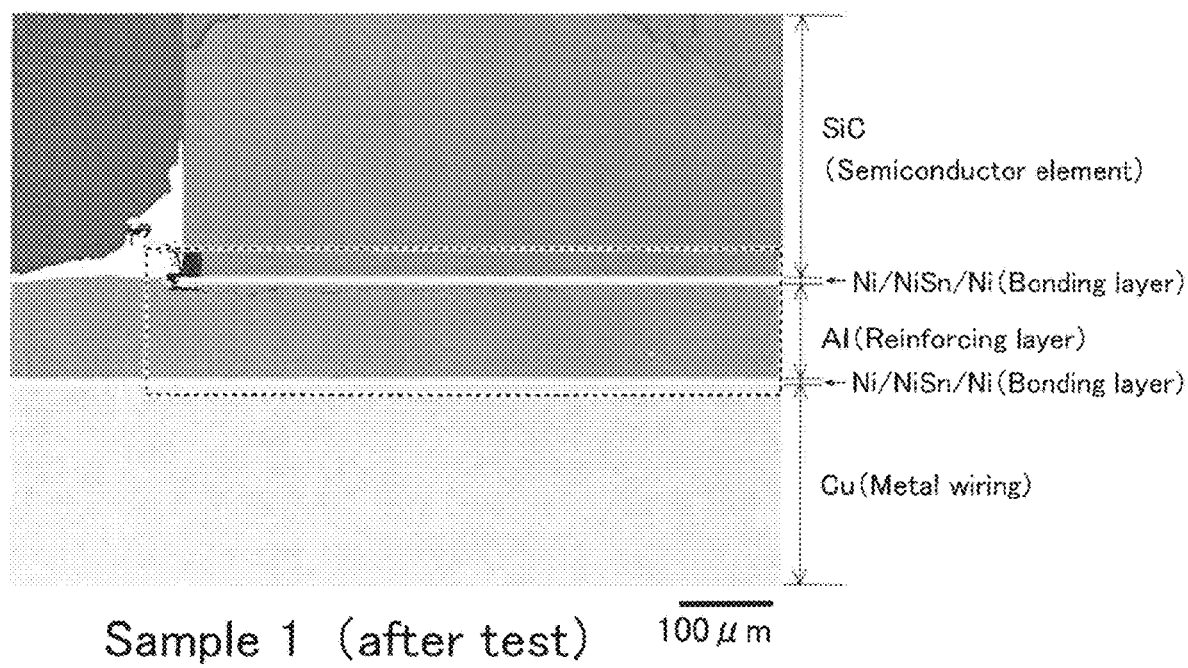
FIG. 6B is a SEM image representing the cross section of the bonding part of Sample 1 after the test.

In contrast, as apparent from comparison between FIG. 6A and FIG. 6B, the change before and after the test of Sample 1 is small. As found from FIG. 6B, however, even in Sample 1, a crack is generated in the outer peripheral side end region (guide part composed of the intermetallic compound) of the bonding part after the severe cooling/heating cycle test. This crack progresses to the reinforcing layer (Al layer) to which the guide part is directly connected.

In the case of Sample 1, when the vicinity of the guide part and bonding layer is observed in an enlarged view as presented in FIG. 8, it can be found that the crack is merely introduced to a limited extent from the guide part to the reinforcing layer (in particular, to the side closer to the bonding layer). That is, the crack does not progress to the bonding layer, and no damage such as delamination is observed in the bonding layer at all.

From the above, it can be understood that a highly reliable power module excellent in the thermal fatigue resistance characteristics can be obtained when the reinforcing layer (layer 30) of high ductility in which the progression speed of cracks is slow coexists in the bonding part with the guide part which positively guides the thermal stress acting during the cooling/heating cycle to the reinforcing layer.

Figure 9:
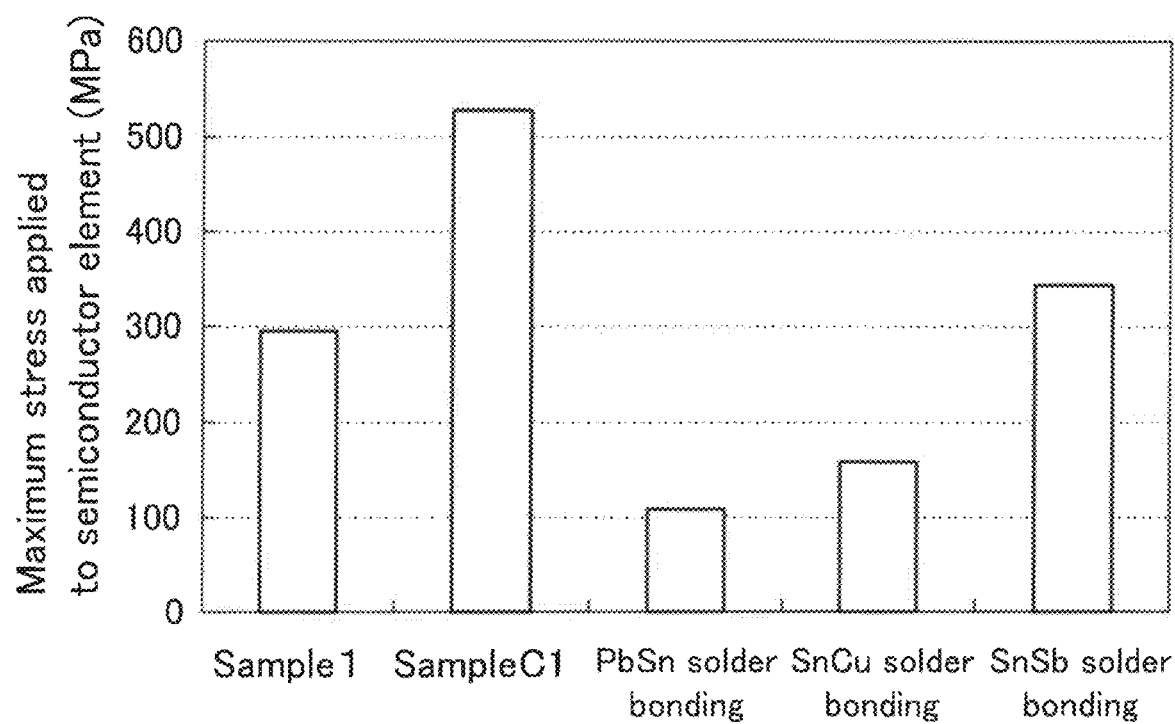
FIG. 9 is a bar graph illustrating the maximum stress acting on a semiconductor element of each sample during a cooling/heating cycle test.

(2) As apparent from FIG. 9, it has been found that, in the case of Sample 1, the maximum stress generated in the semiconductor element 1 during the cooling/heating cycle is drastically low as compared with Sample C1 of the conventional SLID bonding. The maximum stress caused during the cooling/heating cycle test of each sample, in which the semiconductor element 1 and the metal wiring 2 that have a large difference in the coefficient of thermal expansion are bonded under a high-temperature environment, is generated under a low-temperature environment (−40° C.) in the semiconductor element 1 which is a member having a smaller coefficient of thermal expansion.

One of reasons of the low maximum stress of Sample 1 appears to be that the thermal stress acting between the semiconductor element 1 and the metal wiring 2 is relaxed because the reinforcing layer (Al layer) interposed between the bonding parts is readily strained with low rigidity (low Young's modulus).

Thus, when the reinforcing layer having high ductility and low Young's modulus is interposed between the bonding parts, cracks triggered in the bonding parts are suppressed from spreading or progressing, and the maximum stress acting on the bonded members or the bonding parts is also reduced. It is conceivable that these act synergistically so that the example (Sample 1) according to the present invention exhibits the excellent thermal fatigue resistance characteristics and thermal stress relaxation characteristics.

DESCRIPTION OF REFERENCE NUMERALS

M Power module (Bonded structure)
1 Semiconductor element
2 Metal wiring
3 Bonding part
4 Guide part
30 Reinforcing layer
3110 Intermediate layer
3210 Bonding layer

The invention claimed is:

1. A bonded structure comprising:
a first member;
a second member capable of being bonded to the first member; and
a bonding part interposed between a first bond surface at the first member side and a second bond surface at the second member side to bond the first member and the second member,
the bonding part comprising:
a bonding layer composed of an intermetallic compound and bonded to the first bond surface, the intermetallic compound being composed of a first metal and a second metal having a lower melting point than that of the first metal, the intermetallic compound having a higher melting point than that of the second metal;
a reinforcing layer composed of a third metal having higher ductility than that of the first metal;
an intermediate layer composed of the first metal and interposed between the bonding layer and the reinforcing layer so as to be bonded to the bonding layer and the reinforcing layer; and
a guide part composed of the intermetallic compound and provided at least at a part of an outer periphery of the bonding layer existing so as to correspond to the first bond surface, the guide part being directly connected to the reinforcing layer without the intermediate layer in between.

2. The bonded structure as recited in claim 1, wherein the third metal has a lower Young's modulus than that of the first metal.

3. The bonded structure as recited in claim 1, wherein
the first metal is nickel (Ni),
the second metal is tin (Sn), and
the intermetallic compound is nickel tin (NiSn).

4. The bonded structure as recited in claim 2, wherein the third metal is aluminum or aluminum alloy.

5. The bonded structure as recited in claim 1, wherein
the first bond surface has a covering layer composed of the first metal, and
the bonding layer is bonded to the covering layer and the intermediate layer.

6. The bonded structure as recited in claim 1, wherein the first bond surface has a smaller coefficient of thermal expansion than that of the second bond surface.

7. The bonded structure as recited in claim 1, wherein one of the first member and the second member is a semiconductor element and other is a metal wiring.

8. A method of manufacturing the bonded structure according to claim 1, the method comprising:
bonding the first member and the second member by heating a bonding material that is interposed between the first bond surface of the first member and the second bond surface of the second member such that the bonding material forms the bonding part, the bonding material being expanded more than the first bond surface or the second bond surface, and the bonding material comprising:
a first layer composed of the first metal;
a second layer that is composed of the second metal and is formed on a surface of the first layer located at a side of the first bond surface; and
a third layer that is composed of the third metal and is formed on an other surface of the first layer,
wherein during the bonding, a melt of the second metal is leaked to at least a part on the first layer located at an outer peripheral side of the first bond surface, and the bonding material is heated to a temperature equal to or higher than a reaction temperature that allows the intermetallic compound to be generated between the second metal and the first metal, and
forming the guide part composed of the intermetallic compound and provided at least at the part of the outer periphery of the bonding layer existing so as to correspond to the first bond surface, the guide part being directly connected to the reinforcing layer without the intermediate layer in between.

9. The method as recited in claim 8, wherein the bonding further includes controlling a pressurization amount of the bonding material.

10. The method as recited in claim 8, wherein at least a part of the bonding material comprises a laminated material in which two or more of the first layer, the second layer, and the third layer are laminated.

11. The method as recited in claim 8, wherein at least one of the first layer, the second layer, and the third layer is preliminarily formed at the side of the first bond surface or a side of the second bond surface before the bonding.

12. The bonded structure according to claim 1, wherein a length of the bonding part in a length direction orthogonal to a stacking direction of the bonded structure is larger than a length of the first member in the length direction such that the outer periphery of the bonding layer does not overlap the first member in the stacking direction.

13. The bonded structure according to claim 1, wherein at least a part of the guide part does not overlap the first member in a stacking direction of the bonded structure along which the first member, the bonding part, and the second member are stacked.

14. The bonded structure according to claim 1, wherein the guide part is a part of the bonding layer that extends to the reinforcing layer through the intermediate layer.

15. The bonded structure according to claim 1, wherein the intermetallic compound of the guide part is in a solid-phase and is directly connected to the bonding layer and the reinforcing layer without any layer in between.

16. The bonded structure according to claim 1, wherein the guide part is formed by:

forming a body comprising the first member, the second member, and a laminated sheet interposed in between the first member and the second member, the laminated sheet including a first layer composed of the first metal, a second layer composed of the second metal, and a third layer composed of the third metal, the first layer being disposed in between the second layer and the third layer in the laminated sheet; and heating the body to a reaction temperature such that a portion of the second metal in a liquid-phase state leaks to an outer peripheral side of the first bond surface of the first member and flows onto the first layer to react with the first metal of the first layer in an area on the outer peripheral side of the first bond surface, wherein the first metal in the area on the outer peripheral side of the first bond surface is completely consumed to form the intermetallic compound of the guide part on the outer peripheral side of the first bond surface.

\* \* \* \* \*